United States Patent
Jeong

(10) Patent No.: US 8,873,306 B2
(45) Date of Patent: Oct. 28, 2014

(54) PIPE LATCH CONTROL CIRCUIT AND SEMICONDUCTOR INTEGRATED CIRCUIT USING THE SAME

(75) Inventor: Chun Seok Jeong, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 252 days.

(21) Appl. No.: 13/341,005

(22) Filed: Dec. 30, 2011

(65) Prior Publication Data

US 2013/0135942 A1    May 30, 2013

(30) Foreign Application Priority Data

Nov. 29, 2011    (KR) ................. 10-2011-0126142

(51) Int. Cl.
    *G11C 7/10*    (2006.01)
(52) U.S. Cl.
    USPC ................................... 365/189.05
(58) Field of Classification Search
    USPC ................................... 365/189.05
    See application file for complete search history.

(56) References Cited

U.S. PATENT DOCUMENTS

| | | | | |
|---|---|---|---|---|
| 7,492,653 | B2 * | 2/2009 | Ku et al. | 365/201 |
| 2009/0257291 | A1 * | 10/2009 | Kim et al. | 365/189.15 |
| 2010/0033221 | A1 * | 2/2010 | Kim | 327/161 |
| 2010/0246279 | A1 * | 9/2010 | Kim et al. | 365/189.05 |
| 2010/0302873 | A1 * | 12/2010 | Lee | 365/189.05 |
| 2011/0187408 | A1 * | 8/2011 | Byeon et al. | 326/37 |
| 2011/0211397 | A1 * | 9/2011 | Lee | 365/189.05 |
| 2012/0163099 | A1 * | 6/2012 | Lee | 365/189.05 |
| 2012/0188827 | A1 * | 7/2012 | Lee | 365/189.05 |

* cited by examiner

*Primary Examiner* — Hoai V Ho
*Assistant Examiner* — Pablo Huerta
(74) *Attorney, Agent, or Firm* — William Park & Associates Patent Ltd.

(57) ABSTRACT

A pipe latch control circuit and a semiconductor integrated circuit using the same are provided. The pipe latch control circuit includes a read command control unit that receives a first signal and generates a read signal in response to a control signal. In the pipe latch control circuit, the read command control unit selects, in response to the control signal, the first signal or selects a second signal obtained by delaying the first signal according to an internal clock, and generates the selected first or second signal as the read signal.

20 Claims, 8 Drawing Sheets

PIPE LATCH CONTROL CIRCUIT AND SEMICONDUCTOR INTEGRATED CIRCUIT USING THE SAME

CROSS-REFERENCES TO RELATED APPLICATION

The present application claims priority under 35 U.S.C. §119(a) to Korean application number 10-2011-0126142, filed on Nov. 29, 2010, in the Korean Intellectual Property Office, which is incorporated herein by reference in its entirety as set forth in full.

BACKGROUND

1. Technical Field

The present invention relates to a semiconductor integrated circuit, and more particularly, to a pipe latch control circuit of a semiconductor integrated circuit.

2. Related Art

In general, a synchronous memory has a pipe latch so as to input/output consecutive data. The pipe latch is a circuit that stores data provided from a memory cell and then sequentially outputs the stored data in synchronization with a clock.

If the number of pipe latches is increased, a waiting time required in outputting data is generally lengthened, and hence the data can be stably outputted. However, the area occupied by the pipe latches is broadened, and the waiting time required in outputting the data is increased. Therefore, it is not suitable to operate the memory at a high speed. On the contrary, if the number of pipe latches is decreased, the waiting time required in outputting data is shortened, but a timing margin required in outputting the data is not secured. Therefore, the reliability of the operation of the memory cannot be ensured.

FIG. 1 is a timing diagram of data outputted from a general pipe latch. As illustrated in FIG. 1, data is stored in a first pipe latch PIPE0 by a first read command RD1 after a predetermined time tA. The predetermined time tA is a time from when data is detected in a semiconductor memory cell and then stored in a pipe latch.

Since the data stored in the first pipe latch PIPE0 is not outputted, data is stored in a second pipe latch PIPE1 by a second read command RD2 after the predetermined time tA elapses from the application of the second read command RD2. Since the data stored in the first and second pipe latches PIPE0 and PIPE1 are not outputted, data is stored in a third pipe latch PIPE2 by a third read command RD3 after the predetermined time tA elapses from the application of the third read command RD3. The data DQ stored in the first pipe latch PIPE0 is outputted after a first CAS latency CL1.

Here, a CAS latency uses one period of an external clock signal as a unit time, and has time information from the time when a read command is applied to the time when data is outputted.

The output of the data stored in the first pipe latch PIPE0 is started after the first CAS latency CL1, and the output of the data is not completed until the predetermined time tA elapses after the application of a fourth read command RD4. Therefore, the reliability of the operation of the memory is not ensured.

SUMMARY

In one embodiment of the present invention, a pipe latch control circuit includes a read command control unit configured to receive a first signal and generate a read signal in response to a control signal. In the pipe latch control circuit, the read command control unit selects, in response to the control signal, the first signal or selects a second signal obtained by delaying the first signal according to an internal clock, and generates the selected first or second signal as the read signal.

In another embodiment of the present invention, a semiconductor integrated circuit includes a read command control unit configured to receive a first signal and generate a read signal in response to a control signal, a pipe control signal generation unit configured to generate a pipe input signal in response to the read signal, a pipe input control unit configured to generate a pipe control signal in response to the pipe input signal, a pipe latch unit configured to store data in response to the pipe control signal, and a data output unit configured to output the data in response to an output clock. In the semiconductor integrated circuit, the read command control unit selects, in response to the control signal, the first signal or selects a second signal obtained by delaying the first signal according to an internal clock, and generates the selected first or second signal as the read signal.

BRIEF DESCRIPTION OF THE DRAWINGS

Features, aspects, and embodiments are described in conjunction with the attached drawings, in which.

DETAILED DESCRIPTION

Hereinafter, a pipe latch control circuit and a semiconductor integrated circuit using the same according to embodiments of the present invention will be described below with reference to the accompanying drawings through example embodiments.

Figure 1:
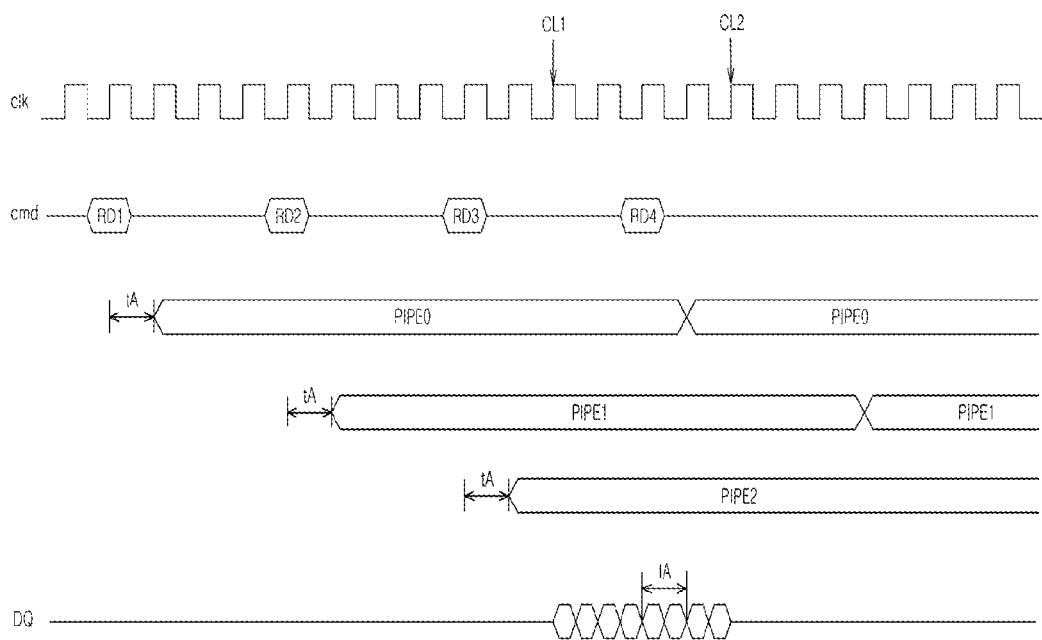
FIG. 1 is a timing diagram of data outputted from a general pipe latch.
Figure 2:
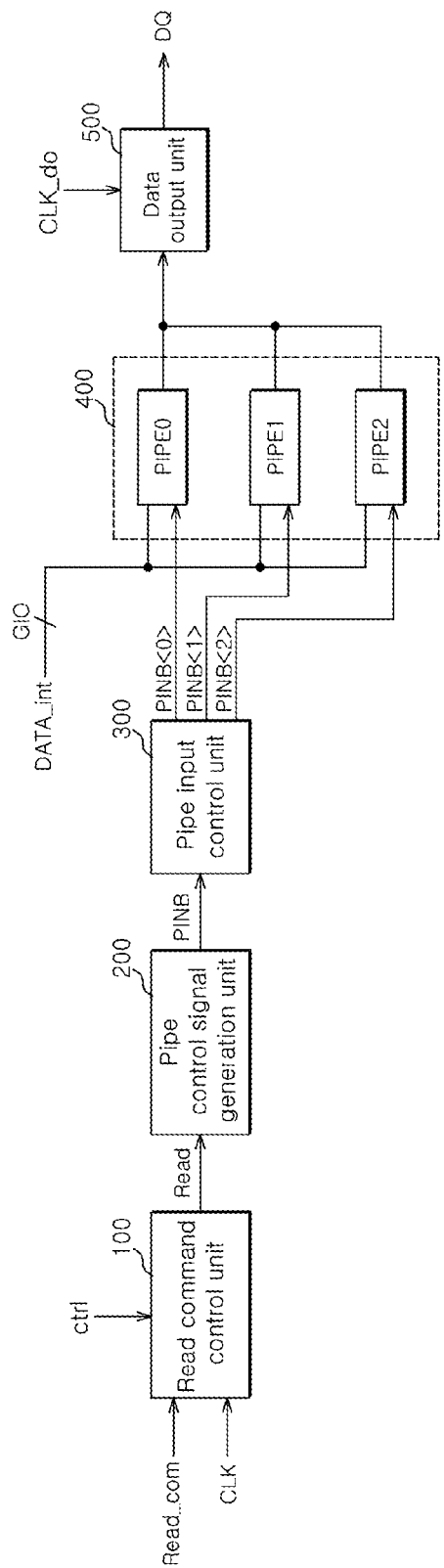
FIG. 2 illustrates a pipe latch control circuit and a semiconductor integrated circuit using the same according to one embodiment.

FIG. 2 illustrates a pipe latch control circuit and a semiconductor integrated circuit using the same according to one embodiment.

Referring to FIG. 2, the pipe latch control circuit and the semiconductor integrated circuit using the same includes a read command control unit 100, a pipe control signal generation unit 200, a pipe input control unit 300, a pipe latch unit 400 and a data output unit 500.

The read command control unit 100 generates a read signal Read in response to an internal clock CLK, a control signal ctrl and a first signal Read_com.

The control signal ctrl applied to the read command control unit 100 is a signal activated by a mode register set (MRS) or test mode signal.

Figure 3:
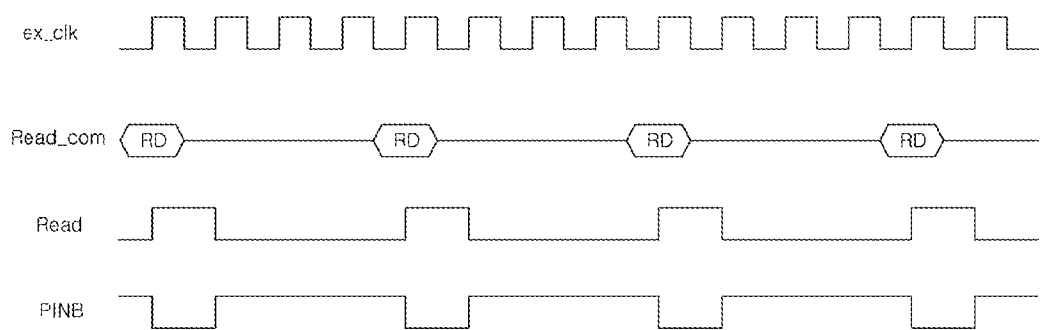
FIG. 3 is a timing diagram of a read signal and a pipe control signal according to an embodiment.

Referring to FIG. 3, the first signal Read_com generates a read command RD at every fourth period (4*tCK) of a clock ex_clk in synchronization with the clock ex_clk.

In this embodiment, it is illustrated that the first signal Read_com generates the read command RD at every fourth period (4*tCK). Also, it is illustrated that the pulse width of the read signal Read is one period (1*tCK).

The read command control unit 100 selects the first signal Read_com as the read signal Read. On the other hand, the read command control unit 100 may select as the read signal Read a signal obtained by delaying the first signal Read_com in response to the internal clock CLK.

In this case, the read command control unit 100 outputs the read signal Read in response to the control signal ctrl.

FIG. 3 is a timing diagram of the read signal and the pipe control signal according to an embodiment.

Referring to FIG. 3, the pipe control signal generation unit 200 generates a pipe input signal PINB in response to the read signal Read. In this embodiment, it is illustrated that the pipe input signal PINB is an inverted signal of the read signal Read.

The pipe input control unit 300 generates pipe control signals PINB<0:2> in response to the pipe input signal PINB.

The plurality of pipe control signals PINB<0:2> refer to signals sequentially activated at every predetermined clock in response to the pipe input signal PINB.

When the pipe input signal PINB is inputted to the pipe input control unit 300, the pipe input control unit 300 generates the pipe control signals PINB<0:2> at every predetermined clock according to a transfer of a logic level of the input signal.

The pipe latch unit 400 sequentially stores input data DATA_int in response to the pipe control signals PINB<0:2>.

The pipe latch unit 400 includes first to third pipe latches. The first pipe latch stores input data DATA_int in response to a first pipe control signal PINB<0>. The second pipe latch stores input data DATA_int in response to a second pipe control signal PINB<1>. The third pipe latch stores input data DATA_int in response to a third pipe control signal PINB<2>.

The data output unit 500 outputs the input data DATA_int stored in the first to third pipe latches of the pipe latch unit 400 as data DQ in response to an output clock CLK_do.

Figure 4:
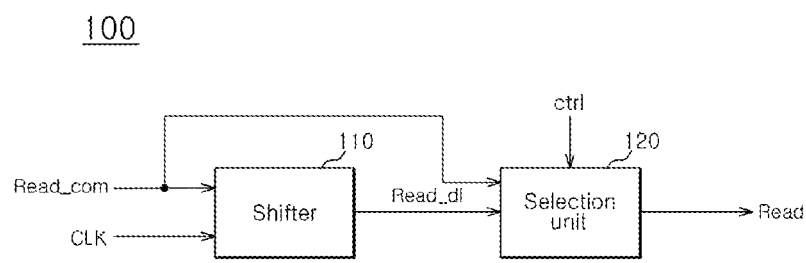
FIG. 4 illustrates a read command control unit according to an embodiment.

FIG. 4 illustrates the read command control unit 100 according to an embodiment.

Referring to FIG. 4, the read command control unit 100 includes a shifter 110 and a selection unit 120.

The read command control unit 100 generates the read signal Read in response to the internal clock CLK, the control signal ctrl and the first signal Read_com.

The shifter 110 generates a second signal Read_dl by delaying the first signal Read_com in response to the internal clock CLK.

The shifter 110 can be configured as a flip-flop, and generates the second signal Read_dl by delaying the first signal Read_com in response to the internal clock CLK.

The selection unit 120 selects the first or second signal Read_com or Read_dl as the read signal Read in response to the control signal ctrl.

More specifically, the control signal ctrl determines an amount of delay of the second signal Read_dl according to the number of pipe latches. The control signal ctrl selects the first or second signal Read_com or Read_dl as the read signal Read.

Figure 5:
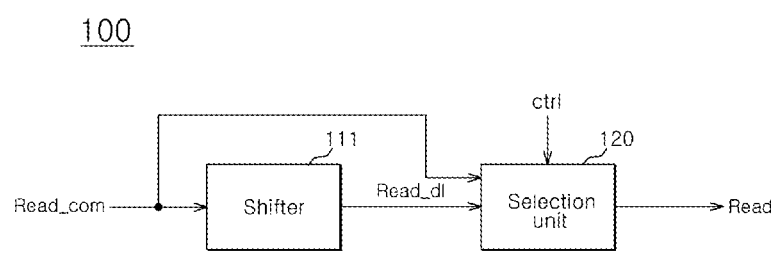
FIG. 5 illustrates another embodiment of the read command control unit.

FIG. 5 illustrates another embodiment of the read command control unit 100.

Referring to FIG. 5, the read command control unit 100 includes a shifter 111 and a selection unit 120.

The read command control unit 100 generates the pipe input signal PINB in response to the control signal ctrl and the first signal Read_com.

The shifter 111 generates a second signal Read_dl by delaying the first signal Read_com.

The shifter 111 can be configured as a delay element, and generates the second signal Read_dl by delaying the first signal Read_com.

The selection unit 120 generates the first or second signal Read_com or Read_dl as the read signal Read in response to the control signal ctrl.

The control signal ctrl determines an amount of delay of the second signal Read_dl, and selects the first or second signal Read_com or Read_dl as the read signal Read.

Figure 6:
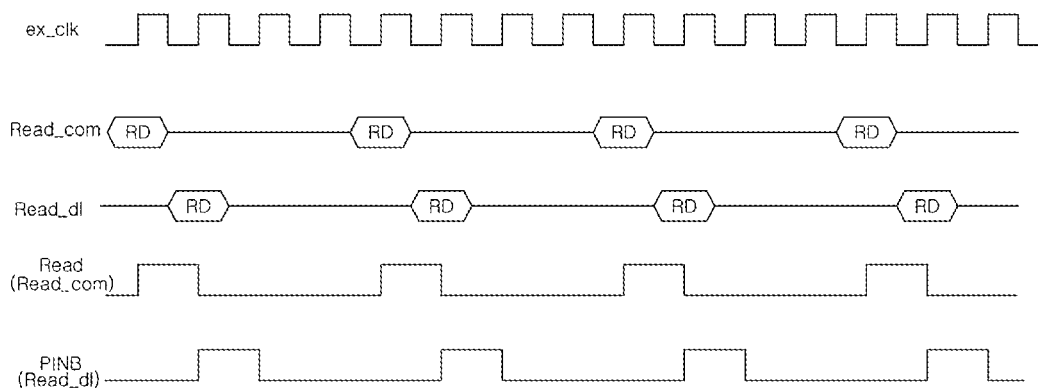
FIG. 6 is a timing diagram of a read signal according to an embodiment.

FIG. 6 is a timing diagram of the read signal Read according to an embodiment.

The timing diagram when the read command control unit 100 selects the first or second signal Read_com or Read_dl as the read signal Read will be described. When the read command control unit 100 selects the second signal Read_dl as the read signal Read, the second signal Read_dl is outputted as a signal obtained by delaying the first signal Read_com by one clock. In one embodiment, it is illustrated that the read command RD of the second signal Read_dl is delayed by one clock as compared with the read command RD of the first signal Read_com. In another embodiment, it is illustrated that the second signal Read_dl is delayed by one or more clocks as compared with the second signal Read_com.

Figure 7:
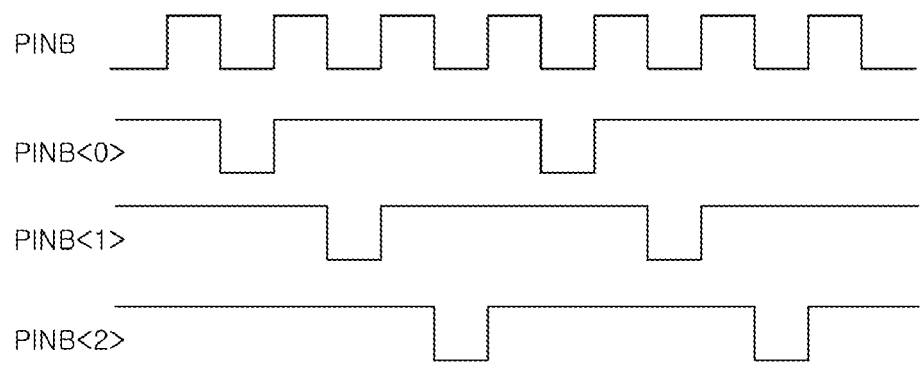
FIG. 7 is a timing diagram of a pipe control signal of the semiconductor integrated circuit according to the embodiment.

FIG. 7 is a timing diagram of the pipe control signal of the semiconductor integrated circuit according to an embodiment.

The pipe input control unit 300 receives the pipe input signal PINB so as to sequentially activate N pipe control signals when the logic level of a signal is transferred. In the present invention, it is illustrated that three pipe control signals PINB<0:2> are activated.

When the logic level of the pipe input signal PINB is transferred to a low level in one period, a first pipe control signal PINB<0> is activated. Subsequently, when the logic level of the pipe input signal PINB is transferred to the low level in the next period, a second pipe control signal PINB<1> is activated. Subsequently, when the logic level of the pipe input signal PINB is transferred to the low level in the next period, a third pipe control signal PINB<2> is activated.

Although it has been illustrated in the present invention that when the logic level of the pipe input signal PINB is transferred to the low level, the pipe control signals PINB<0:2> are activated. The pipe control signals PINB<0:2>, however, can also be activated when the logic level of the pipe input signal PINB is transferred to a high level.

Figure 8:
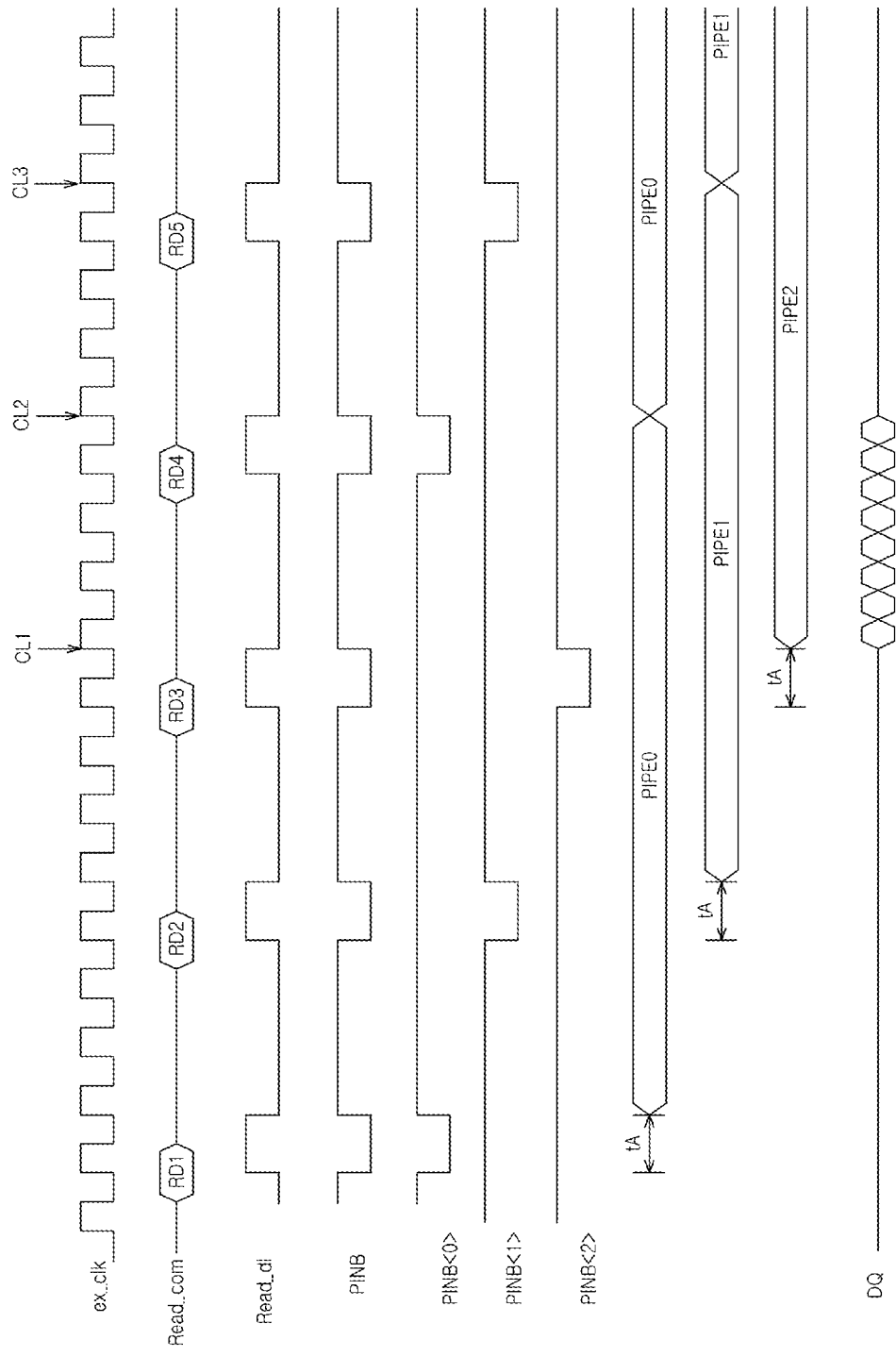
FIG. 8 is a timing diagram of the pipe latch control circuit and the semiconductor integrated circuit using the same according to an embodiment.

FIG. 8 is a timing diagram of the pipe latch control circuit and the semiconductor integrated circuit using the same according to an embodiment.

Referring to FIG. 8, the first or second signal Read_com or Read_dl applies a read command at every predetermined clock period (m*tCK).

In this embodiment, it is illustrated that the read command is applied at every fourth period (4*tCK).

In this embodiment, data is outputted whenever the CAS latency CL is 10.

Each of the first to third pipe latches of the pipe latch unit 400 has a data storage time of 12 periods (12*tCK). Since the read command is applied at every fourth period (4*tCK) and the pipe latch unit 400 includes the three pipe latches, each of the first to third pipe latches of the pipe latch unit 400 has the data storage time of 12 periods (12*tCK).

When the second signal Read_dl is selected as the pipe input signal PINB, the second signal Read_dl is delayed by one period (1*tCK) as compared with the first signal Read_com.

The control signal ctrl inputted to the read command control unit 100 controls the CAS latency CL based on the time when the first signal Read_com is inputted.

If the read command control unit 100 selects the second signal Read_dl, data is internally outputted whenever the CAS latency is 9.

Thus, although the read command control unit 100 internally selects the second signal Read_dl, and therefore, the read command is applied in the state that the second read signal Read_dl is delayed by one period as compared with the first read signal Read_com, the input data DATA_int are sequentially outputted from the first CAS latency CL1.

More specifically, when the read command control unit 100 selects the second signal Read_dl, if the first read command RD1 of the second signal Read_dl is inputted, input data DATA_int is stored in the first pipe latch PIPE0 after the predetermined time tA elapses. If the second read command RD2 of the second signal Read_dl is inputted, input data DATA_int is stored in the second pipe latch PIPE1 after the predetermined time tA elapses. If the third read command RD3 of the second signal Read_dl is inputted, input data DATA_int is stored in the third pipe latch PIPE3 after the predetermined time tA elapses.

The output of the input data DATA_int stored in the first pipe latch PIPE0 is started after the first CAS latency CL1 and then completed at a second CAS latency CL2 at which the input data DATA_int stored in the second pipe latch PIPE1 is outputted.

When the output of the input data DATA_int stored in the first pipe latch PIPE0 is completed, input data DATA_int is again stored in the first pipe latch PIPE0 when the predetermined time to elapses after a fourth read command RD4 is inputted.

Figure 9:
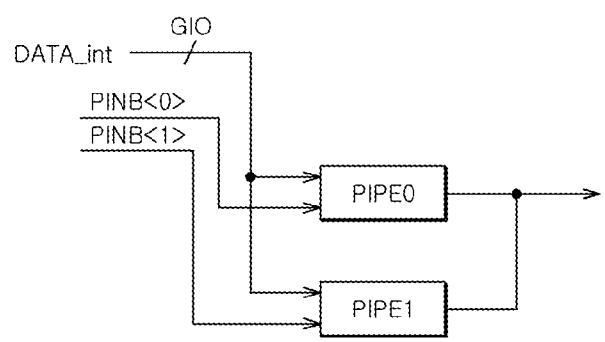
FIG. 9 illustrates another embodiment of a pipe latch unit.

FIG. 9 illustrates another embodiment of the pipe latch unit 400.

In FIG. 9, the pipe latch unit 400 includes a first pipe latch PIPE0 and a second pipe latch PIPE1.

The first pipe latch PIPE0 stores input data DATA_int in response to a first pipe control signal PINB<0>. The second pipe latch PIPE1 stores input data DATA_int in response to a second pipe signal PINB<1>.

Figure 10:
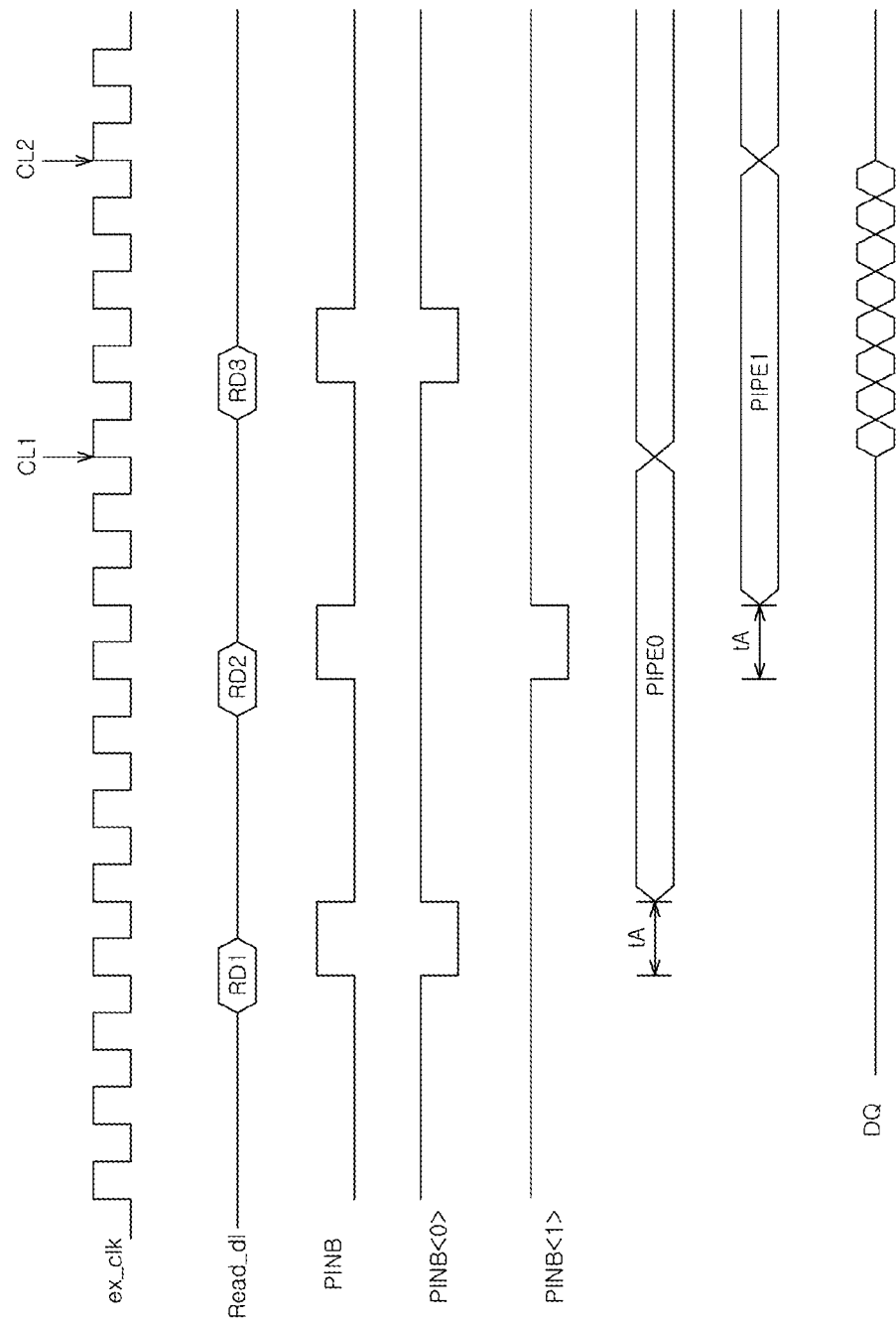
FIG. 10 is a timing diagram of a pipe latch control circuit and a semiconductor integrated circuit using the same according to another embodiment.

FIG. 10 is a timing diagram of a pipe latch control circuit and a semiconductor integrated circuit using the same according to another embodiment.

In this embodiment, it is illustrated that a read command is applied at every fourth period (4*tCK).

In this embodiment, data is outputted whenever the CAS latency CL is 10.

Each of the first and second pipe latches of the pipe latch unit 400 has a data storage time of 8 periods (8*tCK). Since the read command is applied at every fourth period (4*tCK) and the pipe latch unit 400 includes the two pipe latches, each of the first and second pipe latches of the pipe latch unit 400 has the data storage time of 8 periods (8*tCK).

When the second signal Read_dl is selected as the pipe input signal PINB, the second signal Read_dl is delayed by three periods (3*tCK) as compared with the first signal Read_com.

The control signal ctrl inputted to the read command control unit 100 controls the CAS latency CL based on the time when the first signal Read_com is inputted.

If the read command control unit 100 selects the second signal Read_dl, data is internally outputted whenever the CAS latency is 7.

Thus, although the read command control unit 100 internally selects the second signal Read_dl, and therefore, the read command is applied in a state that the second read signal Read_dl is delayed by three periods as compared with the first read signal Read_com, the input data DATA_int are sequentially outputted from the first CAS latency CL1.

More specifically, when assuming that the read command control unit 100 selects the second signal Read_dl, if the first read command RD1 of the second signal Read_dl is inputted, input data DATA_int is stored in the first pipe latch PIPE0 after the predetermined time tA elapses. If the second read command RD2 of the second signal Read_dl is inputted, input data DATA_int is stored in the second pipe latch PIPE1 after the predetermined time tA elapses.

The output of the input data DATA_int stored in the first pipe latch PIPE0 is started after the first CAS latency CL1 and then completed until the second CAS latency CL2 at which the input data DATA_int stored in the second pipe latch PIPE1 is outputted.

If the output of the input data DATA_int stored in the first pipe latch PIPE0 is completed, input data DATA_int is again stored in the first pipe latch PIPE0 when the predetermined time to elapses after the third read command RD3 is inputted.

While certain embodiments have been described above, it will be understood to those skilled in the art that the embodiments described are by way of example only. Accordingly, the circuit described herein should not be limited based on the described embodiments. Rather, the circuit described herein should only be limited in light of the claims that follow when taken in conjunction with the above description and accompanying drawings.

What is claimed is:

1. A pipe latch control circuit, comprising a read command control unit configured to receive a first signal and generate a read signal in response to a control signal; and
   a pipe latch unit configured to store input data in response to a pipe control signal which is generated based on the read signal,
   wherein the read command control unit selects and outputs, in response to the control signal, one of the first signal or and a second signal obtained by delaying the first signal according to an internal clock.

2. The pipe latch control circuit according to claim 1, wherein the read command control unit comprises:
   a shifter configured to generate the second signal by delaying the first signal in response to the internal clock; and
   a selection unit configured to select the first or second signal in response to the control signal and output the selected first or second signal as the read signal.

3. The pipe latch control circuit according to claim 2, wherein the shifter is a flip-flop.

4. The pipe latch control circuit according to claim 1, wherein the read command control unit comprises:
   a shifter configured to generate the second signal by delaying the first signal; and a selection unit configured to select the first or second signal in response to the control signal and output the selected first or second signal as the read signal.

5. The pipe latch control circuit according to claim 4, wherein the shifter is a delay element.

6. The pipe latch control circuit according to claim 1, wherein the control signal is a mode register set or test mode signal.

7. The pipe latch control circuit according to claim 1, wherein the control signal determines an amount of delay of the second signal according to a number of pipe latches which the pipe latch unit comprises.

8. The pipe latch control circuit according to claim 1, wherein the control signal controls a CAS latency based on the first signal.

9. A semiconductor integrated circuit, comprising:
a read command control unit configured to receive a first signal and generate a read signal in response to a control signal;
a pipe control signal generation unit configured to generate a pipe input signal in response to the read signal;
a pipe input control unit configured to generate a pipe control signal in response to the pipe input signal;
a pipe latch unit configured to store data in response to the pipe control signal; and
a data output unit configured to output the data in response to an output clock,
wherein the read command control unit selects and outputs, in response to the control signal, one of the first signal and a second signal obtained by delaying the first signal according to an internal clock.

10. The semiconductor integrated circuit according to claim 9, wherein the read command control unit comprises:
a shifter configured to generate the second signal by delaying the first signal in response to the internal clock; and
a selection unit configured to select the first or second signal in response to the control signal and output the selected first or second signal as the read signal.

11. The semiconductor integrated circuit according to claim 10, wherein the shifter is a flip-flop.

12. The semiconductor integrated circuit according to claim 9, wherein the read command control unit comprises:
a shifter configured to generate the second signal by delaying the first signal; and
a selection unit configured to select the first or second signal in response to the control signal and output the selected first or second signal as the read signal.

13. The semiconductor integrated circuit according to claim 12, wherein the shifter is a delay element.

14. The semiconductor integrated circuit according to claim 9, wherein the control signal is a mode register set or test mode signal.

15. The semiconductor integrated circuit according to claim 9, wherein the control signal determines an amount of delay of the second signal according to a number of pipe latches.

16. The semiconductor integrated circuit according to claim 9, wherein the control signal controls a CAS latency based on the first signal.

17. The semiconductor integrated circuit according to claim 9, wherein the pipe control signal generation unit generates the pipe input signal by inverting the read signal.

18. The semiconductor integrated circuit according to claim 9, wherein the pipe input control unit sequentially generates the pipe control signal in response to the pipe input signal.

19. The semiconductor integrated circuit according to claim 9, wherein the pipe input control unit generates the pipe control signal according to a transfer of the logic level of the pipe input signal.

20. The semiconductor integrated circuit according to claim 9, wherein the pipe latch unit comprises a plurality of pipe latches.

* * * * *